United States Patent
Han et al.

(10) Patent No.: US 9,359,667 B2
(45) Date of Patent: Jun. 7, 2016

(54) LOW TEMPERATURE DEPOSITION APPARATUS

(75) Inventors: Kyul Han, Yongin (KR); O-Hyun Kwon, Yongin (KR); Dong-Woo Shin, Yongin (KR); Seul-Ong Kim, Yongin (KR); Byoung-Ki Choi, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 714 days.

(21) Appl. No.: 13/602,668

(22) Filed: Sep. 4, 2012

(65) Prior Publication Data

US 2013/0174782 A1 Jul. 11, 2013

(30) Foreign Application Priority Data

Jan. 9, 2012 (KR) .................. 10-2012-0002551

(51) Int. Cl.
| | |
|---|---|
| *C23C 14/12* | (2006.01) |
| *C23C 14/20* | (2006.01) |
| *C23C 14/24* | (2006.01) |
| *C23C 14/54* | (2006.01) |

(52) U.S. Cl.
CPC ............... *C23C 14/12* (2013.01); *C23C 14/20* (2013.01); *C23C 14/24* (2013.01); *C23C 14/541* (2013.01)

(58) Field of Classification Search
CPC ........................ C23C 24/243; C23C 4/2431
USPC ................................................ 118/726, 727
See application file for complete search history.

(56) References Cited

U.S. PATENT DOCUMENTS

| | | | | |
|---|---|---|---|---|
| 4,505,948 A | * | 3/1985 | Pinkhasov | 427/580 |
| 4,608,866 A | * | 9/1986 | Bergquist | 73/40.7 |
| 4,686,365 A | * | 8/1987 | Meek et al. | 250/281 |
| 4,800,100 A | * | 1/1989 | Herbots et al. | 427/527 |
| 5,451,258 A | * | 9/1995 | Hillman et al. | 118/715 |
| 5,703,394 A | * | 12/1997 | Wei et al. | 257/433 |
| 2008/0145534 A1 | * | 6/2008 | Lee et al. | 427/255.6 |
| 2009/0151512 A1 | * | 6/2009 | Nakatani | 75/351 |

FOREIGN PATENT DOCUMENTS

| | | |
|---|---|---|
| KR | 10-2003-0038268 | 5/2003 |
| KR | 10-0434546 | 5/2004 |
| KR | 10-2004-0098055 | 11/2004 |
| KR | 10-2005-0033558 | 4/2005 |
| KR | 10-0700221 | 3/2007 |
| KR | 10-2009-0072065 | 7/2009 |
| KR | 10-2010-0081978 | 7/2010 |

OTHER PUBLICATIONS

L. P. Ma et al. Organic Electrical Bistable Devices and Rewritable Memory Cells. Applied Physics Letters: vol. 80, No. 16: Apr. 22, 2002: 2997-2999.

* cited by examiner

*Primary Examiner* — Keath Chen
(74) *Attorney, Agent, or Firm* — Robert E. Bushnell, Esq.

(57) ABSTRACT

A low temperature deposition device according to the present invention includes: a thermal deposition source unit spraying a deposition beam; a differential pumping unit connected to the thermal deposition source unit and passing the deposition beam; and a cooling gas inlet connected to the differential pumping unit and inserting a cooling gas inside the differential pumping unit to cool the deposition beam. According to the present invention, the inorganic deposition beam of low temperature is deposited on the substrate to form the inorganic metal layer of low temperature so that the damage to the organic layer may be minimized when forming the inorganic metal layer of low temperature on the organic layer.

6 Claims, 3 Drawing Sheets

LOW TEMPERATURE DEPOSITION APPARATUS

CLAIM OF PRIORITY

This application makes reference to, incorporates the same herein, and claims all benefits accruing under 35 U.S.C. §119 from an application earlier filed in the Korean Intellectual Property Office on the Jan. 9, 2012 and there duly assigned Ser. No. 10-2012-0002551.

BACKGROUND OF THE INVENTION

1. Field of the Invention

The present invention relates generally to a low temperature deposition device, and preferably, relates to a low temperature deposition device used to manufacture an organic light emitting diode (OLED) display.

2. Description of the Related Art

An organic light emitting diode (OLED) display includes two electrodes and an organic emission layer disposed therebetween, and electrons injected from one electrode and holes injected from the other electrode are coupled with each other on the organic emission layer to form excitons, and the excitons emit light while emitting energy.

For the organic light emitting diode (OLED) display, an organic layer is sequentially deposited on a patterned transparent electrode on a glass substrate through a vacuum thermal evaporation process, and then an inorganic metal layer such as aluminum (Al) is deposited with a thickness of more than several hundred angstroms through the vacuum thermal evaporation process. As described above, by dividing the deposition process of the organic layer and the deposition process of the inorganic metal layer, damage to the organic layer by the inorganic metal layer is minimized.

However, when the inorganic metal layer deposited in the thermal deposition process at more than 500° C. and the organic layer deposited in the thermal deposition process at less than 500° C. are co-evaporated, the organic layer may be easily changed. Also, when the organic layer is deposited, and then the inorganic metal layer is sequentially deposited thereon, the underlying organic layer is easily changed.

Accordingly, in a conventional thermal deposition process, to prevent the change of the organic layer, a plurality of the organic layers are firstly formed, and the inorganic metal layer is finally formed one time. Also, to minimize the change of the organic layer, a buffer layer is applied or a method reversely using the change of the organic layer is used. Accordingly, in the organic light emitting diode (OLED) display, the co-deposition of the inorganic metal layer and the organic layer is limited.

The above information disclosed in this Background section is only for enhancement of an understanding of the background of the described technology, and therefore it may contain information that does not form the prior art that is already known in this country to a person of ordinary skill in the art.

SUMMARY OF THE INVENTION

The present invention provides a low temperature deposition device which prevents a change of an organic layer under deposition of an inorganic metal layer.

A low temperature deposition device according to an exemplary embodiment includes: a thermal deposition source unit spraying a deposition beam; a differential pumping unit connected to the thermal deposition source unit and passing the deposition beam; and a cooling gas inlet connected to the differential pumping unit and inserting a cooling gas inside the differential pumping unit so as to cool the deposition beam.

The differential pumping unit may include a first high vacuum unit connected to the thermal deposition source unit, a low vacuum unit connected to the first high vacuum unit and connected to the cooling gas inlet, and a second high vacuum unit connected to the low vacuum unit.

The low temperature deposition device may further include a first deposition hole formed at a first boundary wall dividing a first high vacuum unit and a low vacuum unit and passing the deposition beam, and a second deposition hole formed at a second boundary wall dividing the low vacuum unit and a second high vacuum unit and passing the deposition beam.

The first high vacuum pump and the second high vacuum pump may be connected to the first high vacuum unit and the second high vacuum unit, respectively, and the low vacuum pump may be connected to the low vacuum unit.

The first high vacuum unit may include a first high vacuum deposition tube directly connected to the thermal deposition source unit and passing the deposition beam, and a first high vacuum pump tube connected vertically to the first high vacuum deposition tube and connected to the first high vacuum pump.

The second high vacuum unit may include a second high vacuum deposition tube passing the deposition beam, and a second high vacuum pump tube connected vertically to the second high vacuum deposition tube and connected to the second high vacuum pump.

The low vacuum unit may include a first low vacuum pump tube disposed parallel to the first high vacuum pump tube, a second low vacuum pump tube disposed parallel to the second high vacuum pump tube, and a low vacuum deposition tube connecting the first low vacuum pump tube and the second low vacuum pump tube to each other and passing the deposition beam.

According to the present invention, the thermal deposition source unit spraying the deposition beam, the differential pumping unit passing the deposition beam, and the cooling gas inlet inserting the cooling gas inside the differential pumping unit so as to cool the deposition beam are included so that the inorganic metal layer of low temperature may be formed by depositing the inorganic deposition beam of low temperature onto the substrate.

Accordingly, damage to the organic layer may be minimized when forming the inorganic metal layer of low temperature on the organic layer by using the low temperature deposition device according to an exemplary embodiment of the invention.

Also, the organic deposition beam and the inorganic deposition beam of low temperature are simultaneously deposited and mixed to form the organic/inorganic mixture layer by using the thermal deposition device irradiating the organic deposition beam and the low temperature deposition device irradiating the inorganic deposition beam. As a result, the inorganic deposition beam of low temperature does not affect the organic deposition beam, and as a result, the organic/inorganic mixture layer having good characteristics may be formed.

BRIEF DESCRIPTION OF THE DRAWINGS

A more complete appreciation of the invention, and many of the attendant advantages thereof, will be readily apparent as the same becomes better understood by reference to the following detailed description when considered in conjunc-

BRIEF DESCRIPTION OF THE DRAWINGS

Figure 1:
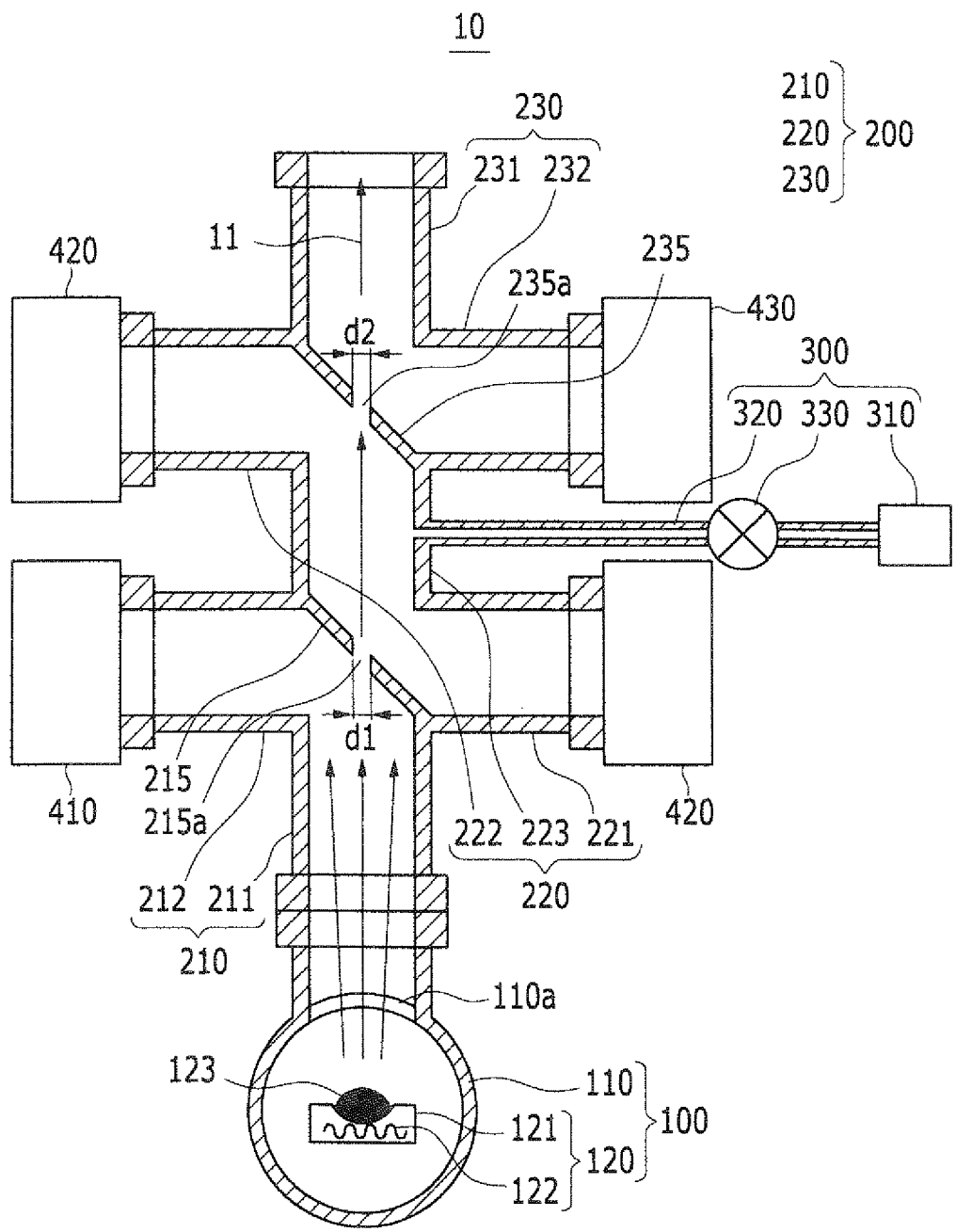
Figure 2:
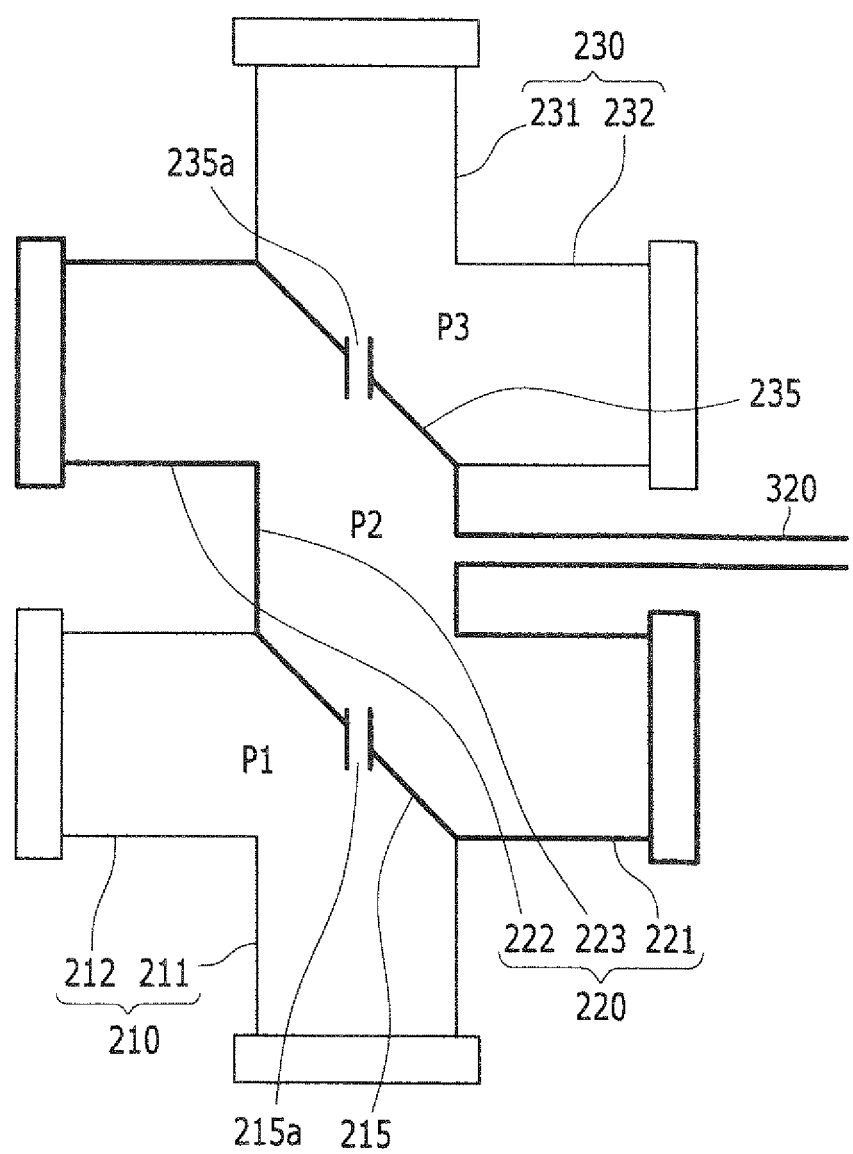
Figure 3:
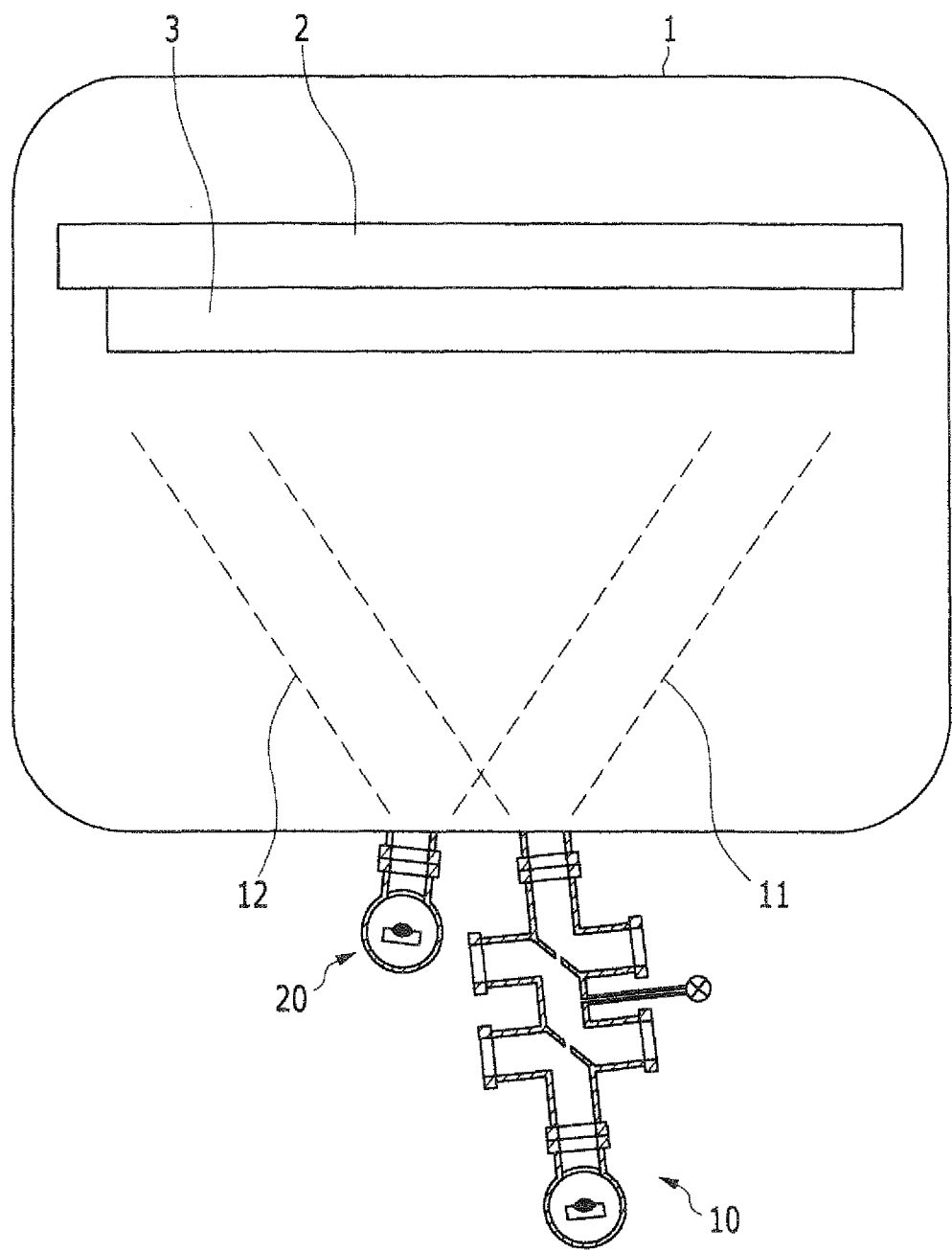

FIG. 1 is a cross-sectional view of a low temperature deposition device according to an exemplary embodiment of the invention;

FIG. 2 is a view of a vacuum distribution of a low temperature deposition device according to an exemplary embodiment of the invention; and FIG. 3 is a view of a state for forming an organic/inorganic mixture layer by using a low temperature deposition device according to an exemplary embodiment of the invention.

DETAILED DESCRIPTION OF THE INVENTION

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

The drawings and description are to be regarded as illustrative in nature and not restrictive. Like reference numerals designate like elements throughout the specification.

A low temperature deposition device according to an exemplary embodiment of the invention will now be described with reference to FIG. 1 to FIG. 3.

FIG. 1 is a cross-sectional view of a low temperature deposition device according to an exemplary embodiment of the invention, and FIG. 2 is a view of a vacuum distribution of a low temperature deposition device according to an exemplary embodiment of the invention.

As shown in FIG. 1 and FIG. 2, a low temperature deposition device 10 according to an exemplary embodiment of the invention includes a thermal deposition source unit 100 for spraying a deposition beam 11, a differential pumping unit 200 connected to the thermal deposition source unit 100 for passing the deposition beam 11, and a cooling gas inlet 300 connected to the differential pumping unit 200 for inserting a cooling gas inside the differential pumping unit 200 so as to cool the deposition beam 11.

The thermal deposition source unit 100 includes a thermal source chamber 110 and a thermal deposition source 120 installed inside the thermal source chamber 110.

The thermal source chamber 110 maintains a vacuum state and may be made of a steel use stainless (SUS) material.

The thermal deposition source 120 includes a deposition container 121 filled with a deposition material 123 of an inorganic material, and a heating member 122 enclosing the deposition container 121 and heating the deposition container 121 so as to change the deposition material 123 into the deposition beam 11 having directionality.

The deposition beam 11 generated by the thermal deposition source 120 is transmitted to the differential pumping unit 200 through an opening 110a in the thermal source chamber 110.

The differential pumping unit 200 includes a first high vacuum unit 210 connected to the thermal deposition source unit 100, a low vacuum unit 220 connected to the first high vacuum unit 210 and connected to the cooling gas inlet 300, and a second high vacuum unit 230 connected to the low vacuum unit 220.

A first high vacuum pump 410 and a second high vacuum pump 430 are connected to the first high vacuum unit 210 and the second high vacuum unit 230, respectively, and the low vacuum pump 420 is connected to the low vacuum unit 220.

As the first high vacuum pump 410 and the second high vacuum pump 430, a turbo-molecular pump or a cryogenic pump may be used to maintain the first high vacuum unit 210 and the second high vacuum unit 230 with a high vacuum.

As the low vacuum pump 420, a rotary vane pump may be used to maintain the low vacuum unit 220 with a low vacuum.

The first high vacuum unit 210 includes a first high vacuum deposition tube 211 directly connected to the thermal deposition source unit 100 for passing the deposition beam 11, and a first high vacuum pump tube 212 vertically connected to the first high vacuum deposition tube 211 and connected to the first high vacuum pump 410.

The second high vacuum unit 230 includes a second high vacuum deposition tube 231 for passing the deposition beam 11, and a second high vacuum pump tube 232 vertically connected to the second high vacuum deposition tube 231 and connected to the second high vacuum pump 430.

The low vacuum unit 220 includes a first low vacuum pump tube 221 disposed parallel to the first high vacuum pump tube 212, a second low vacuum pump tube 222 disposed parallel to the second high vacuum pump tube 232, and a low vacuum deposition tube 223 connecting the first low vacuum pump tube 221 and the second low vacuum pump tube 222 to each other, and passing the deposition beam 11.

The first low vacuum pump tube 221, the second low vacuum pump tube 222, and the low vacuum deposition tube 223 are disposed as described above, and thereby the pressures of the low vacuum pump 420 affecting the deposition beam 11 passing through the low vacuum deposition tube 223 are the same on the left and right sides. Accordingly, the deposition beam 11 may progress without a twist.

The first high vacuum unit 210 and the second high vacuum unit 230 do not include a medium that loses heat from the deposition beam 11 of high temperature. However, an inactive cooling gas, such as nitrogen and argon, is filled inside the low vacuum unit 220 so that heat may be taken from the deposition beam of high temperature.

When the vacuum degree of the first high vacuum unit 210 is referred to as P1, the vacuum degree of the low vacuum unit 220 is referred to as P2, and the vacuum degree of the second high vacuum unit 230 is referred to as P3, P2 is $10^2$ to $10^{-9}$ Torr, and P1 and P3 are $10^1$ to $10^{-1}$ Torr. At this point, it may be that log (P2/P1)≥0 and log (P2/P3)≥0.

The first high vacuum deposition tube 211, the low vacuum deposition tube 223, and the second high vacuum deposition tube 231 are disposed in one line so that the deposition beam 11 easily progresses.

A first boundary wall 215 is installed between the first high vacuum unit 210 and the low vacuum unit 220, and a second boundary wall 235 is installed between the low vacuum unit 220 and the second high vacuum unit 230. The first boundary wall 215 is obliquely disposed relative to the first high vacuum pump tube 212 and the first low vacuum pump tube 221, and the second boundary wall 235 is obliquely disposed relative to the second high vacuum pump tube 232 and the second low vacuum pump tube 222.

The first high vacuum unit 210 and the low vacuum unit 220 are connected through a first deposition hole 215a formed in the first boundary wall 215, and the low vacuum unit 220 and the second high vacuum unit 230 are connected through a second deposition hole 235a formed in the second boundary wall 235.

The first deposition hole 215a and the second deposition hole 235a may have a circular shape or various geometrical shapes, or they may be made of a plurality of sub-deposition holes.

The diameter d1 of the first deposition hole 215a may be 0.1 mm to 1000 mm, and the diameter d2 of the second deposition hole 235a may be 0.1 mm to 1000 mm. The diameter d1 of the first deposition hole 215a and the diameter d2 of the second deposition hole 235a may be different.

The deposition beam 11 generated by the thermal deposition source unit 100 sequentially passes the first high vacuum unit 210, the low vacuum unit 220, and the second high vacuum unit 230 through the first deposition hole 215a and the second deposition hole 235a.

The cooling gas inlet 300 includes a cooling gas storage 310 for storing a cooling gas, and a cooling gas transferring unit 320 for transmitting the cooling gas to the low vacuum unit 220.

The cooling gas inlet 300 inserts the cooling gas into the low vacuum unit 220 to cool the temperature of the deposition beam 11 passing through the low vacuum unit 220. At this point, a vacuum maintainer 330 may be installed in the cooling gas inlet 300 so as to maintain the low vacuum of the low vacuum unit 220. The vacuum maintainer 330 may be a leak valve, a throttle valve, or a mass flow controller (MFC).

Accordingly, the deposition beam 11 of high temperature passing through the first high vacuum unit 210 loses the heat to the cooling gas while passing through the low vacuum unit 220, thereby becoming the deposition beam 11 of low temperature. Also, the deposition beam 11 of low temperature is deposited on the substrate through the second high vacuum unit 230.

When the deposition beam 11 is an inorganic deposition beam of low temperature made of an inorganic material, the inorganic deposition beam of low temperature is deposited on the substrate, thereby forming the inorganic metal layer of low temperature.

Accordingly, when forming the inorganic metal layer of low temperature on the organic layer by using the low temperature deposition device according to an exemplary embodiment of the invention, damage to the organic layer may be minimized.

Meanwhile, an organic/inorganic mixture layer may be formed by using the low temperature deposition device according to an exemplary embodiment of the invention.

FIG. 3 is a view showing a state of forming an organic/inorganic mixture layer by using the low temperature deposition device according to an exemplary embodiment of the invention.

As shown in FIG. 3, a thermal deposition device 20 for irradiating an organic deposition beam 12 and the low temperature deposition device 10 according to an exemplary embodiment for irradiating the inorganic deposition beam 11 are simultaneously installed to a deposition chamber 1.

Also, the organic deposition beam 12 is irradiated from the thermal deposition device 20, and simultaneously the inorganic deposition beam 11 of low temperature is irradiated from the low temperature deposition device 10.

Accordingly, the organic deposition beam 12 and the inorganic deposition beam 11 of low temperature are mixed on a substrate 2 positioned in the deposition chamber 1 so as to form an organic/inorganic mixture layer 3. At this point, the inorganic deposition beam 11 has a low temperature so that the organic deposition beam 12 is not affected, thereby forming the organic/inorganic mixture layer 3 having good characteristics.

While the invention has been described in connection with what is presently considered to be practical exemplary embodiments thereof, it is to be understood that the invention is not limited to the disclosed embodiments but, on the contrary, is intended to cover various modifications and equivalent arrangements included within the spirit and scope of the appended claims.

What is claimed is:

1. A low temperature deposition device, comprising:
a thermal deposition source unit for spraying a deposition beam;
a differential pumping unit connected to the thermal deposition source unit for passing the deposition beam;
wherein the differential pumping unit comprises a first high vacuum unit, a second high vacuum unit, and a low vacuum unit disposed between the first high vacuum unit and the second high vacuum unit; and
wherein a first high vacuum pump of the first high vacuum unit is disposed at a same height as a first low vacuum pump of the low vacuum unit, and a second high vacuum pump of the second high vacuum unit is disposed at a same height as a second low vacuum pump of the low vacuum unit; said low temperature deposition device further comprising a cooling gas inlet connected to the low vacuum unit for inserting a cooling gas inside the differential pumping unit so as to cool the deposition beam.

2. The low temperature deposition device of claim 1, wherein:
the first high vacuum unit is connected to the thermal deposition source unit;
the low vacuum unit is connected to the first high vacuum unit; and
the second high vacuum unit is connected to the low vacuum unit.

3. The low temperature deposition device of claim 2, further comprising:
a first deposition hole formed in a first boundary wall dividing the first high vacuum unit and the low vacuum unit for passing the deposition beam; and
a second deposition hole formed in a second boundary wall dividing the low vacuum unit and the second high vacuum unit for passing the deposition beam.

4. The low temperature deposition device of claim 1, wherein the first high vacuum unit includes a first high vacuum deposition tube directly connected to the thermal deposition source unit for passing the deposition beam, and wherein a first high vacuum pump tube is connected to the first high vacuum deposition tube and to the first high vacuum pump.

5. The low temperature deposition device of claim 4, wherein the second high vacuum unit includes a second high vacuum deposition tube for passing the deposition beam, and wherein a second high vacuum pump tube is connected to the second high vacuum deposition tube and to the second high vacuum pump.

6. The low temperature deposition device of claim 5, wherein the low vacuum unit includes a first low vacuum pump tube disposed parallel to the first high vacuum pump tube, a second low vacuum pump tube disposed parallel to the second high vacuum pump tube, and a low vacuum deposition tube connecting the first low vacuum pump tube and the second low vacuum pump tube to each other for passing the deposition beam.

* * * * *